(12) United States Patent
Garner (10) Patent No.: US 6,657,758 B1
(45) Date of Patent: Dec. 2, 2003

(54) VARIABLE SPECTRUM GENERATOR SYSTEM

(75) Inventor: Harold R. Garner, Flower Mound, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 09/561,561

(22) Filed: Apr. 28, 2000

Related U.S. Application Data (63) Continuation-in-part of application No. 09/326,526, filed on Jun. 4, 1999, now Pat. No. 6,295,153.
(60) Provisional application No. 60/087,948, filed on Jun. 4, 1998.

(51) Int. Cl.[7] .............................................. G02B 26/08
(52) U.S. Cl. ........................ 359/196; 359/201; 359/202
(58) Field of Search ................................. 359/196–226, 359/885, 889, 350, 355; 256/317–318; 250/458.1, 461.1; 347/232, 238, 241, 243; 435/286.1, 286.2, 289.1, 292.1

(56) References Cited

U.S. PATENT DOCUMENTS

| | | | |
|---|---|---|---|
| 5,333,034 A | * 7/1994 | Gu et al. .......................... 355/32 |
| 5,424,186 A | 6/1995 | Fodor et al. ...................... 435/6 |
| 5,539,517 A | 7/1996 | Cabib et al. ................. 356/346 |
| 5,587,832 A | 12/1996 | Krause ........................ 359/385 |
| 5,623,281 A | 4/1997 | Markandey et al. ......... 345/108 |
| 5,661,594 A | 8/1997 | Rhoads et al. ............... 359/299 |
| 5,696,616 A | 12/1997 | Wagensonner .............. 359/201 |
| 5,726,718 A | 3/1998 | Doherty et al. .............. 348/771 |
| 5,744,305 A | 4/1998 | Fodor et al. ...................... 435/6 |
| 5,784,162 A | 7/1998 | Cabib et al. ................. 356/346 |
| 5,817,462 A | 10/1998 | Garini et al. ...................... 435/6 |
| 5,828,497 A | 10/1998 | Neumann et al. ........... 359/634 |
| 5,833,360 A | 11/1998 | Knox et al. ................. 362/293 |
| 5,844,588 A | 12/1998 | Anderson .................... 347/135 |
| 5,870,176 A | 2/1999 | Sweatt et al. .................. 355/53 |
| 5,872,655 A | 2/1999 | Seddon et al. ............... 359/588 |
| 5,912,181 A | 6/1999 | Petcavich .................... 436/151 |
| 5,930,027 A | 7/1999 | Mentzer et al. ............. 359/298 |
| 6,160,618 A | * 12/2000 | Garner ........................ 356/318 |

OTHER PUBLICATIONS

Glenn H. McGall, Anthony D. Barone, Martin Diggelman, Stephen P.A. Fodor, Erik Gentalen and Nam Ngo, "The Efficiency of Light–Directed Synthesis of DNA Arrays on Glass Substrates," Journal of the American Chemical Society, Jun. 4, 1997, pp. 5081–5090.

Ann Cavini Pease, Dennis Solas, Edward J. Sullivan, Maureen T. Cronin, Christopher P. Holmes and Stephen P.A. Fodor, "Light–Generated Oligonucleotide Arrays for Rapid DNA Sequence Analysis," Proc. Natl. Acad. Sci. USA, vol. 91, May 1994, pp. 5022–5026.

Enoch Kim, Younan Xia and George M. Whitesides, "Polymer Microstructures Formed by Moulding in Capillaries," Nature, vol. 376, Aug. 17, 1995, pp. 581–584.

Larry J. Hornbeck, Digital Light Processing for High-Brightness, High–Resolution Applications, Texas Instruments Incorporated, pp. 1–14.

(List continued on next page.)

Primary Examiner—James Phan
(74) Attorney, Agent, or Firm—Gardere Wynne Sewell LLP (57) ABSTRACT

An apparatus and method for regulating the behavior of an atomic, molecular or cellular target is disclosed that includes a light source positioned to redirect light from the light source toward the target site. The light source may be, e.g., a combination of a light and a micromirror array or a liquid crystal display. A computer connected to, and controlling, the light source and a variable spectrum generator is placed in the path of light produced by the light source, wherein the light that is passed through said variable spectrum generator is of one or more wavelengths of light and may be used for, e.g., microscopy or image scanning.

20 Claims, 4 Drawing Sheets

OTHER PUBLICATIONS

Tom Strachan, Marc Abitbol, Duncan Davidson and Jacques S. Beckmann, "A New Dimension for the Human Genome Project: Towards Comprehensive Expression Maps." Nature Genetics, vol. 16, Jun. 1997, pp. 126–132.

Steven A. Sundberg, Ronald W. Barrett, Michael Pirrung, Amy L. Lu, Benjang Kiangsoontra and Christopher P. Holmes, "Spatially–Addressable Immobilization of Macromolecules on Solid Supports," J. Am. Chem. Soc. 1995, pp. 12050–12057.

William Feldman and Pavel Pevzner, "Gray Code Masks for Sequencing by Hybridization," Genomics, 1994, pp. 233–235.

Linda A. Chrisey, C. Elizabeth O'Ferrall, Barry J. Spargo, Charles S. Dulcey and Jeffrey M. Calvert, "Fabrication of Patterened DNA Surfaces," Nucleic Acids Research, 1996, vol. 24, No. 15, pp. 3040–3047.

Jay T. Groves, Nick Ulman and Steven G. Boxer, "Micropatterning Fluid Lipid Bilayers on Solid Supports," Science, vol. 275, Jan. 31, 1997, pp. 651–653.

Miri Park, Christopher Harrison, Paul M. Chaikin, Richard A. Register and Douglas H. Adamson, "Block Copolymer Lithography: Periodic Arrays of 1011 Holes in 1 Square Centimeter," Science, vol. 276, May 30, 1997, pp. 1401–1404.

Glenn McGall, Jeff Labadie, Phil Brock, Greg Wallraff, Tiffany Nguyen and William Hinsberg, "Light–Directed Synthesis of High–Density Oligonucleotide Arrays Using Semiconductor Photoresists," Proc. Natl. Acad. Sci. USA., vol. 93, Nov. 1996, pp. 13555–13560.

Kevin M. O'Brien, Jonathan Wren, Varshal K. Dave, Dian Bai, Richard D. Anderson, Simon Rayner, Glen A. Evans, Ali E. Dabiri and Harold R. Garner, "ASTRAL, A Hyperspectral Imaging DNA Sequencer," Review of Scientific Instruments, vol. 69, No. 5, May 1998, pp. 1–6.

"Optical Equipment Imaging Systems," R & D 100 Awards, Sep. 2000, Write in 2014, p. 141.

* cited by examiner

VARIABLE SPECTRUM GENERATOR SYSTEM

This application claims priority from, and is a Continuation-in-Part application of Provisional Patent Application Ser. No. 60/087,948, filed Jun. 4, 1998, now U.S. patent application Ser. No. 09/326,526, filed Jun. 4, 1999, now U.S. Pat. No. 6,295,153.

TECHNICAL FIELD OF THE INVENTION

The present invention relates in general to the field of optical irradiation, and more particularly, to an apparatus and method for custom spectral illumination using a computer controlled digital light processing micromirror or liquid crystal array and a linear variable filter to produce controlled spectra in time and space for use in, for example, microscopy, tissue engineering, image scanning and modifying cellular responses.

BACKGROUND OF THE INVENTION

Without limiting the scope of the invention, its background is described in connection with known devices that are capable of directing light to specific locations using micromirror or digital light processor (DLP) arrays, as an example.

Heretofore, in this field, the analysis of biologically relevant samples has been accomplished using techniques that detect the presence of a marker or markers in known and unknown samples. To detect the presence of these markers, techniques such as, e.g., radiolabelling, fluorescence or enzymatic labeling, have been used to detect the presence or absence of binding between a component of the sample and a substrate or matrix on which the appropriate binding group or ligand has been immobilized. These methods, however, have been limited to the detection of samples and have not extended the use of technology to the modulation of cellular and other responses.

One such detection system is described in U.S. Pat. No. 5,744,305 is issued to Fodor, et al., in which a synthetic strategy for creating large scale chemical diversity in an array is described. Solid-phase chemistry, photolabile protecting groups and photolithography are used to obtain a light directed spatially-addressable parallel chemical synthesis. Using binary masking techniques, a reactor system is used that can be used to improve data handling and collection. The system described, however, uses a single light source and is limited to detection individual samples.

Another system and method of detection of samples is described in U.S. Pat. No. 5,424,186 issued to Fodor, et al. A method for synthesizing oligonucleotides on a solid substrate is described. The substrate used in the device described provides for the incorporation of semiconductor structures that are used to detect binding of samples to an array of ligands on the surface of the semiconductor. The system, however, is only useful for the detection of the material permanently attached to the surface of the chip. The system also requires an expensive customized reader to provide a limited output.

In parallel with the development of detection systems is the advent of Digital Light Processing, which has been pioneered by Texas Instruments as a way to achieve control of light using digital technology. Involving major innovations in micromachining and semiconductor electronics, Texas Instruments designed a single chip with mechanically actuated micromirrors, each 17 microns in size and with up to 2 million mirrors. Each DLP is capable of simultaneous control of each micromirror on a 20-microsecond time scale. The DLP is now the central component of many computer and video projection systems on the market. Unique to the DLP, is its ability to project a wide range of light spectra because the modulation component is, e.g., an aluminum mirror and not a liquid crystal.

SUMMARY OF THE INVENTION

It has been found that present apparatus and methods fail to meet the demands for a low cost, efficient, customizable method of creating spectrally controlled, small scale projection of light for use in the detection of variations in fluorescence as well as for light directed regulation of cellular functions. Present projection techniques require the use of multiple filters to create large scale projection systems that are not customizable for location, size, time variations, intensity and wavelength.

The present invention is based on the recognition that rapid, discrete wavelength changes are not possible due to the need to change filters at one or more locations in the light path. Present systems are incapable of being designed and used, at a reasonable cost to achieve the needed diversity for rapid changes in pattern and wavelength of the light projection. The present invention may be used in a wide variety of applications to provide one or more wavelengths of light in a controlled manner for use as a light source for microscopy, tissue engineering, two and three dimensional image scanning and even for modifying cellular responses.

More particularly, the present invention is an apparatus for generating a time and spatially dependent light spectrum that includes a light source positioned to direct a light output, a computer connected to, and controlling, the light source and a variable spectrum filter placed in the path of the light redirected by the light source. The variable spectrum filter passes one or more wavelengths of light that are redirected by the light source under the control of the computer. The light that enters the variable spectrum generator may be a beam, a line or even a light curtain. The light may be of one or more wavelengths, that is, simple or complex light. The light that passes the variable spectrum generator will be/of one or more wavelengths depending on the wavelength resolution of the variable spectrum generator and or the spatial width of the light directed toward the variable spectrum generator. After passing the variable spectrum generator the passed light may be used for microscopy, for imaging or even to generate a light curtain having defined wavelength characteristics in time and space. The light that passes the variable spectrum generator may even be a two dimensional light in which one axis provides for varying wavelengths and the other provides a position in space. A complex multiwavelength signal at this point may be detected by a CCD camera, deconvoluted by a computer or used for microscopy, tissue engineering, image scanning or modifying cellular responses.

A computer is connected to, and controls, a digital micromirror device (DMD) (aka digital light processor (DLP)) or generated by a liquid crystal display (LCD) that is placed in the path of light to be redirected by the micromirror or liquid crystal display. Light that strikes or is reflected by the DMD or selectively passed by a liquid crystal display (LCD) is then filtered using a Linear Variable Filter (LVF). In one embodiment, one LVF is placed before and one after the DMD to control the wavelength that strikes the DMD or LCD and that which is reflected by the DMD or generated by the LCD. In another embodiment, the LVF is used before the DMD or LCD. Light may be directed at the though lenses both before and after the light strikes, e.g., the DMD. Furthermore, light that is directed at the DMD or generated by the LCD may be of one or more wavelength and in a variety of shapes and sizes. Generally, the application of light to cells or tissue will determine the intensity and pattern of the light projected through the DMD. The light might strike the DMD as a single ray of light that rasterizes or scans through the DMD, strikes a portion or the entire surface area of the DMD, as a light line, spot, square, oval or in any shape necessary to achieve the necessary illumination of, e.g., cells or tissues.

A light source for use with the present invention in conjunction with a DMD is a lamp or laser, such as a UV light. In an alternative embodiment the light source may be, e.g., a xenon lamp, or a mercury lamp, a laser or a combination thereof or may even be generated by an LCD. The light produced by the light source may also be visible light. One advantage of using UV light is that it provides photons having the required high energy for biological or chemical reactions. UV light is also advantageous due to its wavelength providing high resolution. Lenses may be positioned between the light source and the computer controlled light modulator, which may be a micromirror or liquid crystal array or display, or between the micromirror and the target. An example of such a lens is a diffusion lens.

The light mediated stimulation, activation, inactivation or reaction may be, e.g., the dimerization of adjacent nucleotide bases to a third nucleic acid segment that is being used for, e.g., targeting gene expression. By targeting gene expression both a decrease and an increase in gene expression is encompassed.

Likewise, the light redirected by the micromirror may catalyze a chemical reaction, e.g., an amino acid addition reaction or the addition, removal or crosslinking of organic or inorganic molecules or compounds, small or large at the target site. For example, during the addition of a nucleic or an amino acid residue, the light may deprotect protecting groups of, e.g., phosphoamidite containing compounds. Light may also be responsible for the crosslinking or mono-, bi-, or multi-functional binding groups or compounds to attach molecules such as, fluorochromes, antibodies, carbohydrates, lectins, lipids, and the like, to the substrate surface or to molecules previously or concurrently attached to the substrate.

The present invention also includes a method of patterning light on a target by steps of: generating a light line, directing the light line into a variable spectrum generator, passing one or more wavelengths of light through the variable spectrum generator and illuminating a target with the one or more wavelengths of light passed through the variable spectrum generator. The target can also be physically moved relative to the light being directed to it.

The method of the present invention may further include the step of controlling, using a computer, the micromirror, which may be a light mirror array such as, e.g., a Texas Instruments Digital Light Processor. The illuminating light beam may be a UV, or other light source that is capable of, e.g., catalyzing a chemical reaction or causing a change in the state of a cell. By "changing the state of a cell" it is meant that the cell undergoes a change that causes it to, e.g., divide, stop dividing, activate cellular functions such as the formation of lysozomes, secretion of proteins, hormones and the like. The present method may also be used for the in situ removal of cells by providing a light at an intensity sufficient to eliminate cellular functions, as will be known to those of skill in the art of photochemistry.

The method of the present invention may further include the step of, identifying a patient having a target site in need of light treatment and directing the light beam at the target site of the patient. The method may also include the steps of positioning the target site on or within a patient, flooding the target site a light catalyzable reaction chemical, such as a nucleotide or amino acid residue having, e.g., photoreactive side-groups, and exposing the chemicals reagents to light. The light catalyzable reaction chemical is activated and a reaction synthesis or decomposition is caused by light at the location where the micromirror redirects light on the target site, but not where the micromirror does not redirect light. The present invention may be used, e.g., in "stepper" or "rasterizer" fashion, wherein the micromirror is directed at a portion of the target, that portion of the target exposed to light from the micromirror, and then "stepper" or "rasterizer" on to a different portion. The new portion of the target exposed may be, e.g., overlapping or adjacent to the first portion.

The present invention may even be used as a general light source when an application calls for a light source that generates a controlled light spectra. The one or more spectra may be controlled in either time, space or both. In fact, the shape, wavelength, location and timing of the light may be controlled using the present invention. As a general light source the apparatus, system and method disclosed herein may be used for three dimensional scanning and for fluorescence and general light microscopy.

The timing, location, intensity, shape and wavelength of light may also be used to control the location and growth of cells in tissue engineering application, for example, to control the shape and location of growth of particular cells within a three-dimensional matrix. Furthermore, the timing, location, intensity, shape, timing and frequency of pulsing and wavelength of light may also be used to cause the regulation of cellular function. By regulation of cellular functions it is meant that cells may be caused to apoptose, grow, divide, secrete or cease secretion of cytokines and other chemical messengers and mediators, spread, adhere or de-adhere and the like.

BRIEF DESCRIPTION OF THE DRAWINGS

For a more complete understanding of the features and advantages of the present invention, reference is now made to the detailed description of the invention along with the accompanying figures. Corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which may be embodied in a wide variety of specific contexts. The specific embodiments discussed herein are merely illustrative of specific ways to make and use the invention and do not delimit the scope of the invention.

Digital Optical Chemistry System

The present invention uses Digital Light Processing technology (Texas Instruments, U.S.A.) with optical deprotection photochemistry (e.g., Affymetrix, U.S.A.), to create an apparatus and method for dynamically generating a light with controlled wavelengths using a variable spectrum filter and high diversity arrays of light at varying intensities. The present invention overcomes the limitations of the traditional filters by eliminating the need for one or more filters that control the wavelengths of light. The present invention is also based on the recognition that DLP systems may be used to pattern light for the illumination of substrates or targets at discrete controllable and diverse wavelengths. The present invention thus overcomes the problem of changing filters each and every time a wavelength is to be selected or changed. The present invention may be made as a portable platform for the construction of unique high-density arrays of light with varying intensities, wavelengths and patterns.

Figure 1:
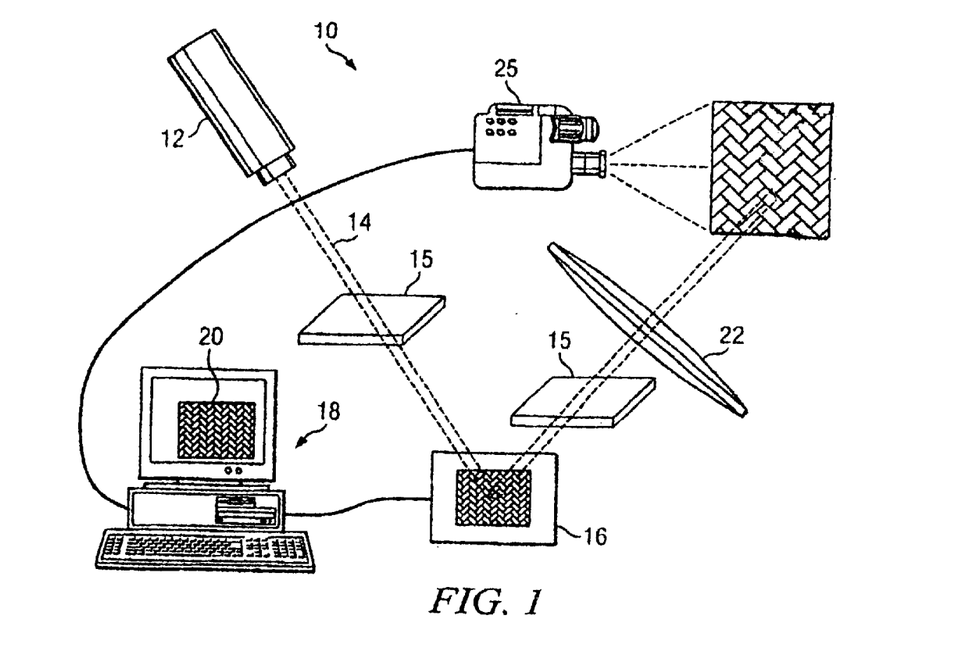
FIG. 1 is a diagram of the basic physical components of a micromirror imager.

FIG. 1 shows a depiction of a basic micromirror imager 10. The micromirror imager 10 has a light source 12 that produces light 14, which may be a light beam. Alternatively the light 14 may be patterned or the shape controlled by optics, gates, grids, lenses and the like to form a pattern, line, raster pattern or spot. The light source 12 may be, e.g., a Xenon lamp, a mercury lamp, a UV light source or other light sources for use with, e.g., the regulation of cellular functions and/or division or even for light catalyzed chemical reactions. The choice of light source will depend on the exact photochemistry required or chosen, as will be known to those of skill in the art of photoreactivity.

When light 14 is redirected or deflected this may be accomplished by a micromirror 16, such as a Digital Light Processor (DLP) micromirror array (Texas Instruments, U.S.A.). Other light deflection systems may be used with the present invention, including an individual mirror, or other light deflection system. Alternatively, light may be generated by a light source that may or may not cause its own illumination, e.g., a liquid crystal display (LCD). When using an LCD the light may be deflected by a two dimensional pattern presented by the LCD or it may even be generated by the LCD if such an LCD is back-lit A variable spectrum or wavelength filter 15 in the form of a slide is depicted in one of two locations as relates to the micromirror 16. While depicted as a slide, the variable spectrum filters may be designed in a variety of shapes.

One such variable linear filter for use with the present invention is disclosed in U.S. Pat. No. 5,872,655 ('655), issued to Seddon, et al., which discloses a monolithic linear variable filter and method of manufacture (relevant portions incorporated herein be reference). Briefly, a process is disclosed that is suitable for forming multi-layer, monotonic, linear, variable, wedge filter coatings on a single substrate surface and for forming monolithic filter assemblies which incorporate such filters. The monolithic process disclosed uses radially variable filter fabrication techniques in combination with ion-assisted deposition to form stress controlled, radially variable filter coatings of the desired varied optical profile, using, e.g., high and low index materials such as tantala and silica. Stress is minimized by balancing the amount of ion assist and the coating rate. Also disclosed in the '655 patent is an optical filter having stacks arranged so that the magnitude of the characteristic center wavelength of each stack increases from stack to stack along the desired direction of traversal of incident light through the filter. As a result of this sequential construction, diffuse leaks are blocked from transmission through the filter. The diffuse leak-suppressed filter may be formed by various processes, including the monolithic process.

The position of the variable spectrum filter 15 may be controlled manually or by the use of a slide mover (not depicted) to control the location along the slide that corresponds to a specific wavelength. A computer 18 is depicted controlling the positioning of individual mirrors of the micromirror 16 based on a pattern 20. In one embodiment the computer 18 also controls the position of the variable spectrum filter 15 as related to the light 14. The micromirror 16 deflects the light 14 into a lens 22 that may focus or diffuses the light 14 to illuminate a substrate or target 24. Lens 22 may be magnifying or demagnifying, to set the size of the features on the target 24. The lens 22 may also be cylindrical to compress one spatial dimension to form a line of light. The apparatus may also contain a shutter (not depicted) positioned between the light source 12 and the micromirror 16 in order to increase the accuity of light 14 delivery to the micromirror 16. The shutter may also help increase the life-time of the micromirror 16 by decreasing the extent of direct and incident light that strikes the array of mirrors. Substrates or targets 24 that may be used with the present invention include topical or internal tissue and cells, tissue culture cells in dishes or slide and even parts of cells whether affixed or not.

Figure 2:
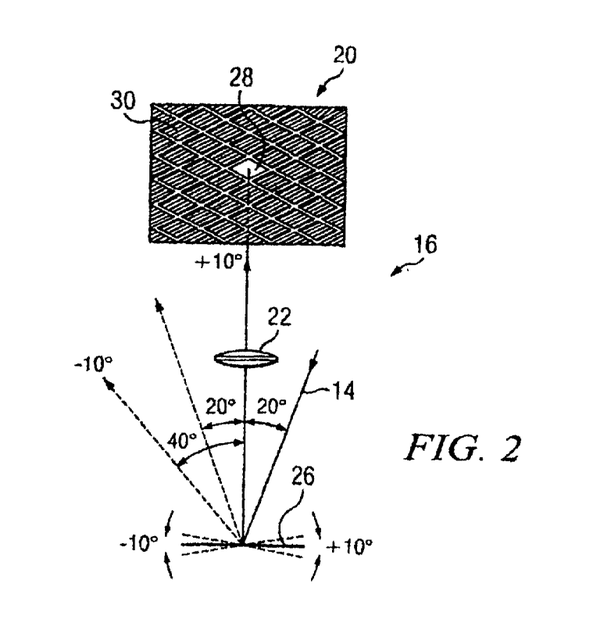
FIG. 2 is a diagram of the basic principles underlying a micromirror.

FIG. 2 shows a diagram illustrating the basic principles underlying a micromirror 16. Light 14 strikes a pixel mirror 26, which rotates around a central axis having a plus or minus ten degree rotation. The incident angle of deflection of the mirror, which for an aluminum DLP-type mirror, is 20 degrees. At plus 10 degrees light is reflected by the pixel mirror 26 into lens 22 and onto the substrate to form a light spot 28 of pattern 20. At any other angle the light is not deflected into the lens and therefore appears as a dark spot 30. Gray scale, which may be used with the present invention in some circumstances, is achieved by fluttering the pixel mirror 26 to produce the analog equivalent of a gray scale image on pattern 20.

Figure 3:
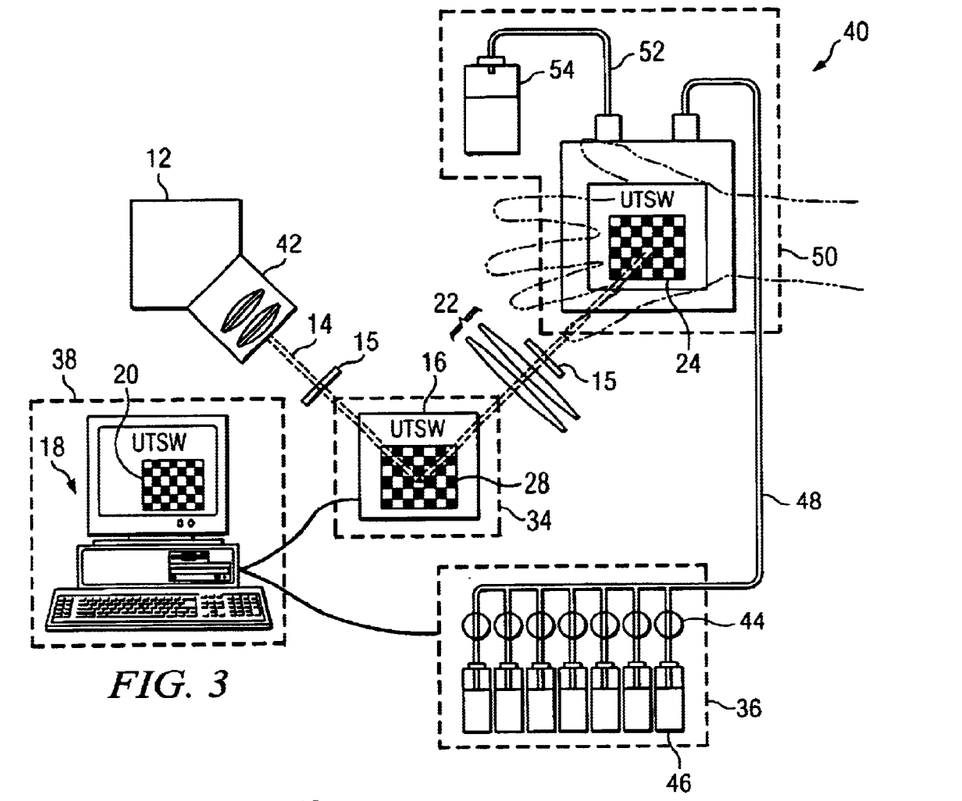
FIG. 3 is a diagram that represents a micromirror imager system.

FIG. 3 shows a diagram representing a micromirror imager system 40. The micromirror imager system of the present invention comprises generally three parts, a DLP micromirror system 34 that selectively directs light 14 onto a target 24 on which the reactions are conducted, a fluidics system 36 that delivers the photoactivatable reagents in proper sequence and a computer system 38 with software that controls the DLP micromirror system 34 according to the desired pattern 20. The micromirror imager system 40 may be used to create individual spots, 20 microns or smaller in size, on a target 24 such as glass, with up to 2 million spots per substrate using the present invention. A variable spectrum or wavelength filter 15 in the form of a slide is depicted in one of two locations as relates to the micromirror 16.

The present invention may also be applied to combinatorial chemistry problems and the manufacture of custom treatment of a patient. An important finding of the present invention was the recognition that the DLP micromirror system could be used to reflect light in the UV range. Light processing systems, such as the DLP micromirror created by Texas Instruments, was intended to be the next generation of high resolution, very bright, color true TV sets, computer monitors/projectors and movie projectors. The DLP micromirror is designed to reflect light in the visible range with a high brightness and brightness efficiency, goals that are presently unattainable by conventional liquid crystal display units. More information on the system is available at "www.ti.com/dlp/", relevant portions of which are incorporated herein by reference.

As with the basic system depicted in FIG. 1, the micromirror imager system 40 is designed as a simple device the illumination of a given area of an target 24 is controlled by a Digital Light Processor (DLP) micromirror 16. The pattern 20 is controllable by controlling the mirror angle using an image on a VGA monitor that is sent by the computer 18 through the DLP micromirror system. For example, one mirror may be used for each pixel on the 640×480 screen. The mirrors of the micromirror 16 are each individually controlled, with the ability to rock its angle on a 2 ms time scale. Grey scales are created by rapidly moving a mirror to project and then not project on a given position.

In this embodiment, the target 24 is mounted in contact with a custom reaction chamber 50 into which one or more photoreactive chemicals are pumped. The chemicals, including all the standard chemicals for photoreactive crosslinking or diagnosis. The chemicals may be kept in syringes and pumped manually to the reaction chamber 50 through a chemical line 48. Alternatively an automated fluidics system 36, as depicted in FIG. 3 may be used to control the input and output of reagents into and out of reaction chamber 50. In this example, the target 24 is illuminated from above with light passing through the target 24. If the target 24 is not light opaque the synthesis may take place on either side of the substrate. As will be apparent to those of skill in the art of optics, light 14 may be reflected from a target 24 that is not light opaque, wherein the light catalyzable reaction occurs at the site of reflection or absorption. The reaction chamber 50 may be moved to make multiple exposures at different positions on the target 24. Biological and chemical reactions can be done in target 24.

The fluidics system 36 of the present invention may include a number of reagent bottles containing synthesis chemicals or biological reagents 46. The synthesis chemicals 46 may be, e.g., placed under pressure under a non-reactive atmosphere, e.g., Argon or Helium, to provide pressure for chemical delivery and to reduce premature oxidation of the synthesis chemicals 46. Valves 44, under the control of a computer such as computer 18 may be used to control the timing of the synthesis chemical or chemicals 46 delivered through chemical line 48 to the reaction chamber 50.

Figure 4:
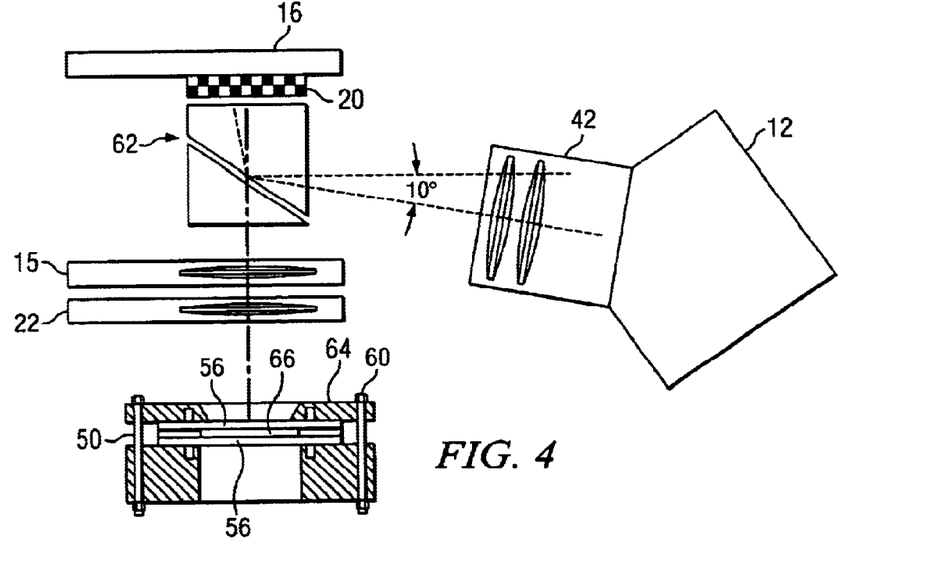
FIG. 4 is a diagram of an alternative lens mirror configuration for focusing the light using the micromirror array.

FIG. 4 is a diagram of an alternative lens mirror configuration for focusing the light using the micromirror 16 for use in, e.g., high throughput cellular analysis systems. A light source 12 is positioned to illuminate a prism set 62. Light from the light source is focused onto the prism set, which in this example is a total internal reflection (TIR) mirror that deflects the light from the mirror surface into the pattern 20 that has been delivered to the micromirror 16. A variable spectrum or wavelength filter 15 in the form of a slide is depicted in one of two locations as relates to the micromirror 16. While a slide is depicted variable spectrum filters may be designed in a variety of shapes. Light reflected by the individual mirrors then traverses the prism set into lens 22, which may be a diffusion lens. The patterned light strikes a reaction chamber, depicted in this figure as a slide holder 60. Two slides 56 are positioned within the slide holder 60. Alternatively, a micrometer plate mover and reader may be positioned in place of the slide holder and chamber for direct analysis of samples in a high throughput environment.

As may be seen from this cross-sectional view of the slide holder 60, a light translucent cover 64 is disposed over the reaction chamber 50. Synthesis chemicals may be pumped into, and evacuated from the reaction chamber 50 through chemical inlets/outlets (not depicted) positioned to be in fluid communication with the interior 66 of the reaction chamber 50. As viewed from the cross-sectional view it is apparent to those of skill in the art, in light of the present disclosure, that reaction chemicals may be delivered to the interior 66 of the reaction chamber 50 from different positions, such as the sides, top or bottom of the reaction chamber 50.

Following are the specifications and characteristics for one embodiment of the micromirror imager system 40 of the present invention:

Control computer—PC with VGA monitor

Software—Image created using PowerPoint, custom Software or CAD software

Digital Light Processor—TI DLP micromirror with 640× 480 resolution

Number of pixels—640×480=307,200

Mirror material—Aluminum

Mirror reflectivity—88%, Verified using monochromater/ PM tube for visible and UV wavelengths Mirror size—16 microns×16 microns in a 20 micron×20 micron space Synthesis spot size—1:1 with mirror size Mirror switching speed—2 ms Light source—100 W mercury burner with peak at 365 nm Light brightness—170,000 cd/cm$^2$=250 W/(cm$^2$*st)

Luminous Flux—2,200 lumens

The apparatus and method of the present invention has been used to: 1) show that the mirror array may project UV light (UV light cannot be passed through conventional liquid crystal displays) at sufficient intensity to conduct photostimulation, 2) demonstrate that images at the focal plane may be created, 3) demonstrate the use of the apparatus and method to activate the secretion of lymphokines, and 4) demonstrate that a dynamic line of custom spectra.

Micromirror System Optics

The optics for use with the present invention may be designed to maintain the system focus while substantially increasing the contrast ratio. A high contrast ratio is critical to obtain high quality differential synthesis which is a function of UV intensity and exposure time. A component that may be used to obtaining higher contrast ratios is the TIR (Total Internal Reflectance) prism, depicted in FIG. 4, that escorts the UV light from the source onto the substrate and then out to the focusing optics. These optics may be customized for a particular DLP micromirror with, e.g., UV transparent glass (BK5, SF5 or K5). The use of a TIR prism is not necessary, as the apparatus and method of the present invention has been used with direct projection via a mirror set having 20 degrees off-axis of the micromirror 16 to match the cant angle of the individual mirrors and lenses. The TIR prism and lens 22, e.g., Acromat doublets or triplets, may be made from UV transparent fused silica (many types are available for 365 nm, near UV). A high power UV source may be used, e.g., a power source of up to 1 kW may be used before reaching a damage threshold for the micromirror 16.

Taking advantage of two powerful technologies: Variable Spectrum Generator and light-sensitive cell lines established from skin, the optimal irradiation protocols for controlling the function of immuno-competent cells and for defining the immunological outcome of custom spectral illumination may be determined. The present invention is directly applicable to the development of entirely new methods for initiating protective immunity against infectious pathogens and cancers and for treating patients with allergic, autoimmune, or infectious disorders.

The present inventor has developed two new technologies, both of which are the essential components for the use of the invention. First, the Variable Spectrum Generator (VSG) is assembled, which provides an irradiation system designed to provide dynamic illumination with any combination of spectra with controlled rhythms. Second, an in vitro assay system was developed for determining the impact of visible and UV irradiation. For example, using three cell lines derived from skin all responded to solar-simulated irradiation were studied to determine the elaboration of different sets of cytokines. Using the VSLG optimal illumination protocols may be established for manipulating the immune system.

More specifically, the Variable Spectrum Generator (VSG) system may be produced to determine the parameters for in vitro irradiation. Also, larger, more powerful irradiation systems or high throughput systems in which one or more cell lines are irradiated with >10,000 different illumination protocols in the high-throughput VSG system may be constructed. Using a VSG illumination protocol designed for a particular skin cell type, including custom protocols, may be used to alter, e.g., immune functions as the skin surface or even internally using fiber optic light delivery.

Skin exposure to solar radiation is known to alter the immune system, however, the unavailability of a dynamic and flexible irradiation systems has prevented investigators from defining the molecular mechanisms for the effect of illumination on cells. The present invention allow an operator to determine the impact of irradiation in a systematic fashion and in a time- and cost-efficient manner. The apparatus, system and methods disclosed herein allow both technical and conceptual framework for the development of general and custom protocols designed to determine the in vivo efficacy of the custom spectral illumination on immune responses in experimental animals and in humans.

A Variable Spectrum Generator (VSG) System may be constructed to provide optimized spectral illumination for the simultaneous irradiation of hundreds of samples, each with its own custom complex time-dependent spectra. Using a Digital Light Processing micromirror from Texas Instruments and a Linear Variable Filters (LVF) from, e.g., Reynard, Inc., which may be used to provide full coverage of the important spectral regions, high-intensity, spatial-dependence and time-course programming of the computer controlled source.

In one embodiment the VSG may use a line of light, where for each position along that line of light the Fourier components of the spectrum may be controlled by combining light projected by a DLP micromirror device through a Linear Variable Filter. Each of these spectra may be controlled in time down to 20 microseconds through computer control of the DLP micromirror. The two dimensional (2D) micromirror system may have its short axis (e.g., 768 pixels) aligned to the spectral axis and the long axis (e.g., 1024 pixels) aligned in the spatial direction. When using a LCD, the resolution of the input and output may be changed according to the limits of resolution of the DLP or LCD. In conjunction with high quality optics, the VSG allows the operator to create 1024 different independent spectra at different positions along a line of light with each spectra assembled with up to 768 discrete components.

A Linear Variable Filter (LVF) for use with the invention may be, e.g., a Reynard Corporation 1"×3" filter, which has a continuously varying dichroic filter that varies along the long axis and is uniform along the short axes. The dimensions of the LVF may be changed according to, e.g., the light intensity, size requirements and resolution. The LVF acts as a continuously varying filter with the bandwidth being set by the spatial resolution of a slit. For example, a large collection of virtual slits created by the DLP micromirror may be used to increase spacial resolution. While current commercial filters cover wavelengths from 400 to 700 nm, it is possible to construct a custom LVF with extended range, especially into the UV.

Figure 5:
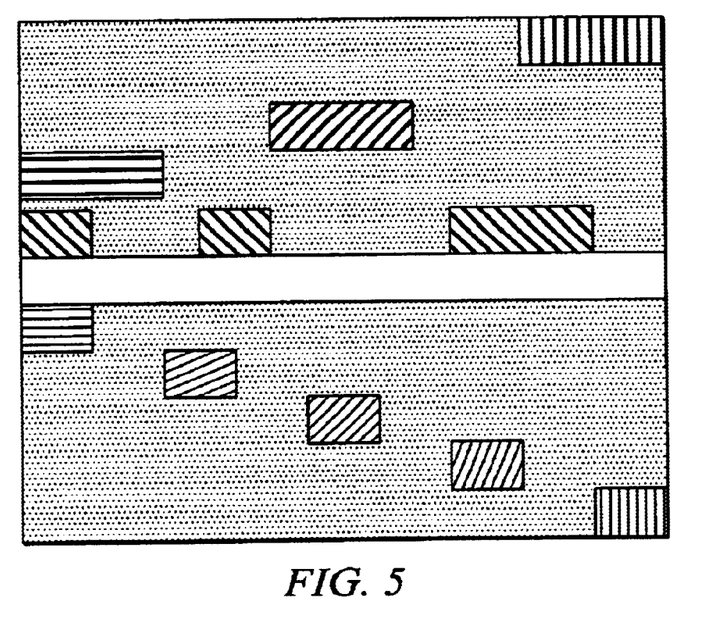
FIG. 5 show two-dimensional images that translate into space (Y) and spectrum (X) that were created to control the VSG using simple Power Point slides.
Figure 6:
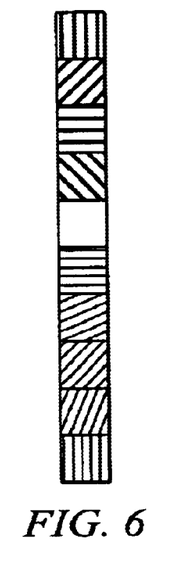
FIG. 6 (right most spectra) shows the matching spectra for the pattern shown in FIG. 5, except that the cumulative light is depicted over time for other images (not shown in FIG. 5)

The Variable Spectrum Generator was assembled from a computer projector micromirror system, a LVF, a computer and a lens system. The computer projects a high contrast black and white images that control the spectrum projected at each position along the line of light. FIGS. 5 and 6 shows projection of an image that may be changed on a 20-microsecond time-scale, if desired, to create time dependent control of the spectrum at each spatial point along the line of light (Y) in FIG. 6. To demonstrate this, FIG. 6 shows 3 different spatial distributions of spectra, projected sequentially by the apparatus of the present invention.

In FIG. 5, the computer controlled the 2D image of the projector (1D is in the spatial direction, Y, and 1D is in the spectral direction, X or Y). In front of the projector is a Linear Variable Filter and a cylindrical lens that assembles the spectrum. The line of light is project against an object on the far right. A cylindrical lens compressed the spectrum along the X or Y dimension of FIG. 5 to make the thin line or light in FIG. 6.

The spectral direction may be along the long horizontal axis and the spatial axis along the vertical axes. As seen in FIGS. 5 and 6, eleven different spectra were programmed to be projected at eleven different positions along a line of light. As shown in FIG. 5, these spectra include complex assemblies of small spectral regions (at the top), to a band that results in white light assembled using all spectral components (the central band) to discrete spectral components of intermediate spectral bandwidth at various positions along the visible spectra (at the bottom). In FIG. 6, three different spectra projected sequentially in time. The rightmost line of light was constructed from the pattern shown in FIG. 5.

The hardware and optics disclosed herein enable an operator to use the full spatial and spectral resolution capabilities of the DLP micromirror chip. It also allows the operator to incorporate a sample mover to provide illumination of hundreds to thousands of samples at the same time in, e.g., culture dishes or microtiter plates. The software for control of the VSG system may be written in Visual Basic, using code modules for control of the DLP micromirror.

In one embodiment of the optics, an optics chain (Brilliant Technologies), allows broad-spectrum light to emerge from a Xenon or Mercury arc lamp, which will provide light from ~250 nm to 900 nm. A 1,000 W lamp (burner) may be used as a source that should provide in excess of 500 mW/cm2. While the present invention may use, e.g., 1:1 illumination other ratios may be used for the projection magnification (e.g., 1:3 final magnification). In the case of the system for scanning in vitro cell dishes or microtiter plates, the magnification may be set to match the size of sample dishes, however, a 1:3 ratio will also reduce the illumination by a factor of three.

Figure 7:
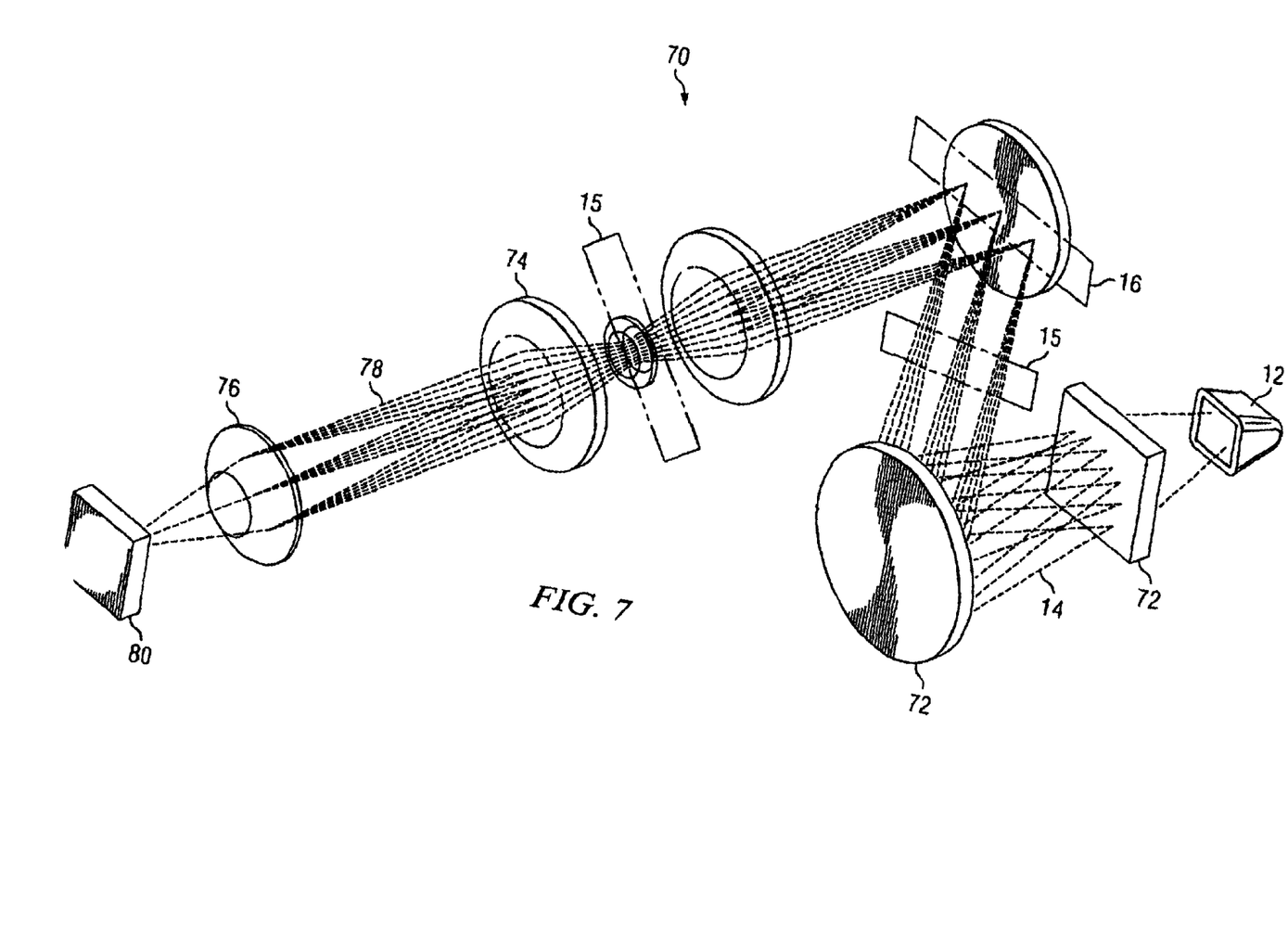
FIG. 7 is a diagram of one embodiment of the optical illumination VSG system of the present invention.

As depicted in FIG. 7, light 14 from a light source 12 passes through a linear variable filter 15 and one or more spherical lenses 72, before the light is imaged on the micromirror 16. As illustrated, a six-lens (BT illumination optics 74) assembly images the micromirror 16 onto the cylindrical lens 76. The lens 76 (e.g., a cylindrical, expander or condenser lens) may be used to collect the spectra at each spatial position along the line of light 78. Optical components may be chosen to enable full spectral coverage, i.e., the use of UV qualified components and coatings, as will be known to those of skill in the art.

Critical to any optical design are two components, the resolution and contrast ratio. The resolution achieved using the design depicted in FIG. 7 exceeded the 17 micron feature size of the micromirror, which permits the apparatus to provide all the advantages of the spatial and spectral resolution (1024, 864, respectively). The contrast ratio is a measure of how black is black and how white is white. Spillover or low contrast ratio will limit the differentiation of the spectra, however, in calculations from measurements in a Digital Optical Chemistry system described hereinabove, the contrast ratio exceeded 256 and is probably close to 500. Therefore, a spectral assembly where each spectral component has a signal to noise ratio of >256 was achieved. Although the micromirror may have 768 pixels in the spectral direction, the spectral resolution is set by the bandwidth of the linear variable filter 15, which may be positioned at one or more different locations, so it is expected to have about 100–200 spectral bins that comprise the assembled spectra. Leveling of the amplitude of each spectral component is done by pulse modulation of each mirror at a 20-microsecond time scale, which is exactly the way grey-scale is created on a computer projector.

Another critical aspect of the filter system is the need to limit the extent of filter aberrations. For example, it is important that the VSG not have polychromatic aberrations so that all wavelengths of light are assembled properly at the image plane. An optional scanning system 80, such as a micromirror array or LCD, may be positioned to redirect the light that has passed through the linear variable filter 15. The scanning system 80 will generally be under computer control, which will provide control of, e.g., intensity, shape, angle of deflection, etc.

A sample holder for use in with in vitro studies may be designed as follows (see also FIG. 4). A line of light may be imaged on a surface that may be moved under computer control. For example, a National Instruments stepper motor driver and amplifier and a Daedel linear drive to position the samples under the light may be used. Precise submicron positioning is not required, so a drive that has 1-micron step size and a linear throw of 5 inches will generally be used. The sample and motion system will allow a series of samples to move into the light path, which may be done to sequentially illuminate the samples or to step back-and-forth between rows of samples to multiplex the light among a larger number of samples.

The entire system may be controlled by a PC computer running Windows NT and custom Visual Basic Software or a Macintosh® iMac® using a G4 processor that provides over one teraflop of processing power. A second computer may operate off-line for code development and for designing spectra and timing protocols for machine operation. The DLP micromirror may interfaced to the computer with a PCI or other such card. The first or second computers may function as a second monitor card, so that whatever image is projected on the computer screen it is simultaneously projected by the DLP micromirror. By using two interfaces or software packages the software design is greatly simplified because simple images only need be projected on the screen.

Visual Basic (VB) may be used as the control language for the VSG system, as it contains all the code components for the VSG system, including provisions for the drivers for the linear motion system. The linear motion system controls may include position coordinates, and control of velocity and timing for placing samples in the light output. VB also has the speed required for use with the VSG. The control software program may have two image generating modules, one that inputs and sequentially displays one or more TIFF images generate by any drawing software program. The control software may also have a module to internally generate images and image projection timings. Software may include a custom spectrum generator as well as a library of spectra (solar, solar adjusted for skin layers, UVA, UVB, etc.) that the operator may choose from while building their illumination spectra and time profile. Windows NT timing protocols will be used by the software to control the illumination timing, which may be as discrete as twenty microseconds to weeks.

Skin was chosen as the target organ of irradiation primarily because of its anatomical location. Two cell types from the outermost layer of skin (epidermis) and an additional cell type from the underlying layer (dermis). The cell types selected included: a) epidermal keratinocytes, b) epidermal Langerhans cells, and c) dermal fibroblasts. All three cell types are known to respond to solar spectrum irradiation and to play immuno-regulatory roles. Cell lines derived from the three cell types may be irradiated with the Variable Spectrum Generator under >10,000 different conditions and then examined for several different immunological properties. Once the illumination protocols for each cell line are established, the specific immune function of a given cell type may be stimulated and monitored in patients using the present invention.

Considerable evidence documents that solar radiation "distorts" the immune system. The significance of this area of investigation is based on knowledge that solar radiation is both useful therapeutically for selected diseases (e.g., psoriasis, atopic dermatitis, and T cell lymphomas) and detrimental in carcinogenesis, skin aging, and immunosuppression. Although several cutaneous resident and immigrant cell populations make unique contributions to this immuno-regulatory effect of radiation, the present description focuses on three cell types, keratinocytes, Langerhans cells, and fibroblasts.

Not only do keratinocytes function as terminally differentiating epithelial cells to form a physical barrier (stratum corneum), they also play an important immuno-regulatory role by the elaboration of cytokines. Keratinocytes have been reported to secrete biologically relevant amounts of IL-1 , IL-3 , IL-6, IL-7, IL-8, IL-10, IL-12, IL-15, granulocyte/macrophage-colony stimulating factor (GM-CSF), colony stimulating factor-1 (CSF-1), tumor necrosis factor-$\alpha$ (TNF$\alpha$), transforming growth factor-$\beta$ (TGF$\beta$), nerve growth factor (NGF), platelet-derived growth factor (PDGF), and basic fibroblast growth factor (bFGF) (Takashima, A. and P. R. Bergstresser. 1996. Impact of UVB radiation on the epidermal cytokine network. *Photochem. Photobiol.* 63:397.). Langerhans cells are skin-resident members of the dendritic cell family of antigen presenting cells, and they are responsible for the induction of T cell-mediated immune responses to a variety of antigens that penetrate or appear in skin, including pathogenic microbes, chemical antigens in the environment, and antigens associated with skin tumors (Banchereau, J. and R. M. Steinman. 1998. Dendritic cells and the control of immunity. Nature 392:245.). Langerhans cells also secrete a variety of cytokines (e.g., IL-1, IL-6, IL-12, and TNFα) upon activation by inflammatory stimuli or during antigen presentation. Assembly of the extracellular matrix was thought to be the major physiological role for fibroblasts in the connective tissue. More recently, however, it has become evident that fibroblasts also secrete selected cytokines (e.g., CSF-1), thereby regulating the function of Langerhans cells. Importantly, solar irradiation is one of the critical factors that regulate the production of these cytokines by skin-resident cells.

Stable Langerhans cell lines were established from epidermis and characterized their phenotypic and functional features. These lines, termed the "XS" series, resemble skin-resident Langerhans cells in many important respects, including surface phenotype, antigen presenting capacity, cytokine and cytokine receptor profiles, and responsiveness to solar irradiation. Stable fibroblast lines, the "NS" series were also established, which resemble fibroblasts that normally reside in the reticular dermis, immediately beneath the dermo-epidermal junction. In addition to these cell lines, the Pam 212 keratinocyte line was used for these studies. These cell lines derived from three different cell types in skin and other may be used in the studies.

The ultraviolet (UV) light range (UVB with 290–320 nm in wavelength and UVA with 320–400 nm) has been generally considered to be responsible for the biological impact of solar irradiation. This notion, however, has been derived solely from the observations that UV irradiation may alter biological function in an expected manner. In other words, no attempts have been made to test whether non-UV ranges (e.g., visible light) in the solar spectra may affect the immune system in an unpredictable manner. The unavailability of refined irradiation systems that would allow the investigation of these responses may be the reason for the lack of follow-up to this biological observation. The present invention addresses the need for a system for spectral illumination with dynamic flexibility in time and location (space).

Relatively limited information has been available with respect to molecular mechanisms by which solar irradiation alters immunological function. Working with the Solar Simulator, which emits a spectrum similar to that of natural sunlight, the present inventor has observed that: 1) irradiation activates the NFkB-dependent gene transactivation cascade in Pam 212 keratinocyte, XS106 Langerhans cell, and NS47 fibroblast cell lines; 2) different cell lines secrete different sets of cytokines in response to radiation; 3) NFKB decoy oligonucleotides (double-stranded, 20 bp oligonucleotides containing the NFKB cis-element) inhibits radiation-induced cytokine production in all three cell lines; and 4) in vivo administration of NF-kB decoy oligonucleotides inhibits inflammatory responses to radiation. These observations indicate that NFKB activation serves as a mechanism by which irradiation affects the immune system, thus, forming a conceptual basis for optimizing the immuno-regulatory illumination protocols.

To be biologically relevant, irradiation with a given wavelength must be absorbed by molecules (chromophores) within target tissues. Absorption leads to photochemical reactions that ultimately changes the function of cells. Chromophores of immunologic interest have included DNA, trans-urocanic acid, and unsaturated membrane lipids. At cellular levels, UV radiation has been shown to: a) trigger cytokine production, b) alter surface expression of adhesion molecules, c) affect mitosis, and d) induce apoptotic cell death (see references). With respect to molecular mechanisms, UV radiation alters cellular function by causing: a) DNA damage, b) the generation of reactive oxygen intermediates, c) ligand-independent signaling through cell surface receptors, such as EGF, TNF, and IL-1 receptors, d) phosphorylation of receptor-associated tyrosin kinases and protein kinase C, and d) activation of selected transcription factors, including NF-KB, AP-1, and AP-2 (see references). These mechanisms are by no means mutually exclusive; rather, they are likely to operate in an interdependent manner.

For example, NF-KB activation may be induced experimentally by damaging DNA chemically, exposure to hydrogen peroxide, clustering of surface receptors, or phosphorylation of tyrosin kinases or protein kinase C (see references). NF-KB activation, in turn, leads to the expression of many genes involved in immunological and inflammatory responses, including genes that encode cytokines, adhesion molecules, and regulators of cell growth and death. In this regard, the results disclosed herein fit a model in which UV photoreceptors presumably at the cell surface deliver NF-kB activation signals and, thus, modulate immunological function. On the other hand, it remains totally unknown whether putative photoreceptors for non-UV wavelength ranges deliver similar (or completely different) signals to the immune system. The present invention may permit such determinations to be made at the molecular level.

Repeated exposure to relatively low doses of UV radiation (primarily UVB) from the conventional FS sunlamps induces antigen-specific immunological tolerance if antigens are applied at the irradiated skin sites. This hapten-specific, "local" tolerance could be transferred adoptively with T cells, suggesting the involvement of immunoregulatory T cells (Elmets, C. A., P. R. Bergstresser, R. E. Tigelaar, P. J. Wood, and J. W. Streilein. 1983. Analysis of the mechanism of unresponsiveness produced by haptens painted on skin exposed to low dose ultraviolet radiation. *J. Exp. Med.* 158:781.). In this model, epidermal resident Langerhans cells appear to serve as a tolerogenic antigen presenting cells. "Systemic" immunosuppression is also inducible by exposure to relatively high doses of UV radiation. In this model, immunosuppressive factors (e.g., IL-10) that are produced by epidermal keratinocytes upon irradiation appear to be responsible for the induction of immunological tolerance. Although the original studies were conducted in mice, Yoshikawa et al. observed a similar susceptibility to UV radiation in humans, with tolerance developing in some patients when immunized through irradiated skin. Importantly, this susceptibility occurred in virtually 100% of patients with skin cancer, suggesting susceptibility to UV-induced immunosuppression as a risk factor for skin cancer. Cooper et al. also documented UV-induced immunosuppression in humans. Once again, although these observations with conventional UV radiation sources support our central hypothesis, they failed to answer the key question concerning the impact of non-UV radiation in the solar spectra on the immune system.

Using the present invention, the magnitude, direction, and type of immune responses may be manipulated by irradiation, but only when a certain combination of light spectra is given with a certain rhythm. Keratinocytes, Langerhans cells, and fibroblasts, which: a) normally reside in skin, b) respond to irradiation, and c) play immunoregulatory roles are of greatest interest. More specifically, we will employ three cell lines, Pam 212 keratinocyte, XS106 Langerhans cell, and NS47 fibroblast lines. In response to irradiation with the solar simulator, these lines secreted biologically relevant amounts of pro-inflammatory cytokines in different profiles; a) vascular endothelial growth factor (VEGF) by Pam 212 keratinocytes, b) TNFα, IL-1 β, and IL-6 by XS106 Langerhans cells, and c) IL-6 and VEGF by NS47 fibroblasts.

Briefly, each of the three cell lines is irradiated: a) with different combinations of emission spectra, b) at different fluences, and c) in different rhythms. This may be achieved most effectively by checker-board analyses, in which a monolayer of a given cell line (cultured over a 50×50 cm square-shaped tissue culture plate) will be exposed to the combinations of 100 different emission spectra (along the X-axis) and 100 different fluences or rhythms (along the Y-axis). At six hours and twenty-four hours after irradiation, the culture plate is subjected to fully automated in situ analyses for: 1) mRNA expression of IL-1 , IL-6, TNFα, and VEGF (in situ hybridization), 2) intracellular accumulation of the same cytokines (immunofluorescence staining), and 3) surface expression of CD54 (ICAM-1) (immunofluorescence staining). All the images are digitized and processed in order to determine the illumination protocols causing the maximal induction for each parameter.

For example, if the maximal induction of IL-1 mRNA expression and IL-1 accumulation is achieved in the XS106 line by repeated exposure to a combination of two spike emission spectra at 450 nm and 600 nm with 0.1 sec intervals, this protocol will define these condition as the optimal "IL-1 inducing" protocol for Langerhans cells. An entirely the optimal protocol for TNFα may be different from that for IL-1 even in the same cell type. The systematic approach disclosed herein will lead to the establishment of refined illumination protocols for stimulating the immune function of keratinocytes, Langerhans cells, and fibroblasts.

To establish protocols for down-regulating the immune function, a combined immnuno-stimulatory protocol with >10,000 different protocols (100 different spectra×100 different fluences or rhythms) may be used. For example, it may be found that IL-1 production induced by illumination at 450 and 600 nm with 0.1 sec intervals is significantly suppressed by simultaneous illumination at 520 nm with 30 sec intervals. If this is the case, the latter condition is defined as "IL-1 suppressing" illumination protocol. Thus, using the apparatus, system and method disclosed herein any cell or cell line should be able to characterized for immune-suppressive protocols for IL-1, IL-6, TNFα, VEGF, and CD54 for each cell line. In fact, cell from a patient from a target site may be isolated, grown in culture and exposed to the scanning protocol disclosed herein to find the correct, localized release of cytokines for the treatment of a specific conditions that is also customized for each individual. Using the database base of known protocols, however, the search may first be directed to known protocols and conditions. Only if these are found to be incorrect or unsatisfactory, are the other spectra and protocols scanned.

As an alternative approach, the illumination protocols for the activation of three transcription factors, i.e., NF-kB, AP-1, and NF-AT, may be determined under a broad hypothesis that these transcription factors must regulate the expression of immunologically relevant genes. For this aim, three EGFP reporter constructs may be employed with known cis-elements for NFkB, AP-1, or NFAT. For example, a luciferase reporter construct for the three transcription factors (Dr. Arthur Weiss, University of California. San Francisco) may be used in which the luciferase gene in these plasmids is replaced with the EGFP gene and insert the neomycin resistant gene for selection. Pam 212 keratinocyte, XS106 Langerhans cell, and NS47 fibroblast lines are transfected with each plasmid and permanent transfectant clones selected. These clones are irradiated with >10,000 different illumination protocols using the Variable Spectrum Generator. Once again, the optimal protocol for the activation of each transcription factor and determination of a repressing protocol may be conducted and conditions for protocol determined.

To fully determine the immunological outcome of irradiation, the same cell lines may be exposed in bulk to the Variable Spectrum Generator under the optimal conditions and then examined for the elaboration of 20 different cytokines (ELISA) and the surface expression of 44 different molecules (e.g., using multi-color flow cytometric analysis). The XS106 Langerhans cells may also be examined after irradiation for their ability to initiate T cell-mediated immune responses in our standard in vitro antigen presenting assays and in living animals (e.g., A/J mice). All the irradiated samples may also be subjected to the gene microarray expression analysis.

Data capture and analysis may be carried out in a Microarray Facility using spotted arrays with large libraries of human and mouse cDNAs (up to 15,000 genes per slide). The digitized data may be processed using a Bayesian Network Clustering analysis to determine the "fingerprint genes" that are induced (or repressed) by irradiation. It is anticipates that these studies may lead to the discovery of unique irradiation-responsive genes that are activated or repressed by radiation only with specific wavelengths and certain rhythms.

Ultimately, a new in vivo irradiation technology that is directly applicable to humans will be developed. Thus, it will be important to "synthesize" the emission spectra in such a manner that they would mimic closely the above action spectra at the surface of keratinocytes, Langerhans cells, or fibroblasts in the skin. To achieve this "synthesis", the absorption spectra of the epidermal sheet and the dermal sheet prepared from human skin is determined. The optimal emission spectra for Langerhans cells may then be synthesized by overlapping the action spectra for Langerhans cells and the absorption spectra of the epidermal sheet. In operation, intact human skin samples are exposed to the synthesized spectra using the Variable Spectrum Generator, and Langerhans cells isolated from these samples are tested for the expression of the genes and proteins of interest.

As described above, it is an established concept that solar irradiation light within the UV range is a potent immunomodulator. The immunological outcome of exposure to different wavelength ranges (or in different combinations) remains totally unknown due to the lack or an apparatus, system and method for making specific determinations. Moreover, no one has studied the impact of radiation that is given with a certain photoreactive rhythm on the immune system.

Yet another example of the operation of the present invention is the activation of nucleic acids at a target site. More conventional chemistries may also be used to attach molecules to the target site, depending on the nature of the target site, the molecules that are being attached and other factors that will be known to those of skill in the art of chemical attachment and synthesis., For example, the reaction of commercially available 3,4-(methylenedioxy) acetophenone with nitric acid followed by ketone reduction, and treatment with phosgene gives chloroformate. Then 5'-hydroxyl of N-acyl-2'-deoxynucleosides reacts with chloroformate, and 3'-hydroxyl reacts with 2'cyanoethyl N,N,N',N'-tetraisopropylphosphorodiamidite to yield photo labile protected phosphoramidites.

Standard phosphoramidite chemistry is adapted to include photo labile protecting groups by replacing the 5'-protecting group DMT, and incorporating photoactivateable hydroxyl linker into the synthesis target. Hydroxyl groups are selectively deprotected by irradiation at a wavelength of 365 nm, and oligonucleotides assembled using standard phosphoramidite chemistry.

A charge coupled display (CCD) camera (i.e., CCD camera 25, see FIG. 1) connected to a lens system may be used to direct the fluorescence level on the target site that has been illuminated by the variable spectrum generator (VSG). The digital data captured by the CCD camera 25 is sent to a computer that matches the position on the target site of the patient. The level of fluorescence is compared to known expression level controls, which may be determined from a trial on tissue culture cells, e.g., those extracted from a biopsy. Data may be displayed in real time, or may be stored for future analysis.

Another use for the VSG of the present invention is for generating a time-dependent optimized illumination and excitation system light source for, e.g., microscopy and imaging applications. For example, the VSG may be used to replace laser or filtered lamps for hyperspectral imaging. One particular application is the use of the VSP for a hyperspectral imaging microscope, for example. The VSG provides for a light source that is simple light that may also be non-time and spatially dependent. It may even be used to replace the light source and optics of epi-fluorscence excitation lines or light.

While this invention has been described in reference to illustrative embodiments, this description is not intended to be construed in a limiting sense. For example, the term "computer" as used herein is to include any control apparatus capable of actuating a micromirror or micromirror array. Various modifications and combinations of the illustrative embodiments, as well as other embodiments of the invention, will be apparent to persons skilled in the art upon reference to the description. It is therefore intended that the appended claims encompass any such modifications or embodiments.

References

1. Takashima, A. and P. R. Bergstresser. 1996. Impact of UVB radiation on the epidermal cytokine network. *Photochem.Photobiol*. 63:397.
2. Banchereau, J. and R. M. Steinman. 1998. Dendritic cells and the control of immunity. *Nature* 392:245.
3. Schuhmachers, G., K. Ariizumi, T. Kitajima, D. Edelbaum, S. Xu, R. K. Shadduck, G. L. Gilmore, R. S. Taylor, P. R. Bergstresser, and A. Takashima. 1996. UVB radiation interrupts cytokine-mediated support of an epidermal-derived dendritic cell line (XS52) by a dual mechanism. *J.Invest.Dermatol*. 106:1023.
4. Timares, L., A. Takashima, and S. A. Johnston. 1998. Quantitative analysis of the immunopotency of genetically transfected dendritic cells. *Proc.Natl.Acad.Sci.USA* 95:13147.
5. Matsue, H., K. Matsue, M. Walters, K. Okumura, H. Yagita, and A. Takashima. 1999. Induction of antigen-specific immunosuppression by CD95L cDNA-transfected "killer" dendritic cells. *Nature Med*. 5:930.
6. Xu, S., K. Ariizumi, G. Caceres-Dittmar, D. Edelbaum, K. Hashimoto, P. R. Bergstresser, and A. Takashima. 1995. Successive generation of antigen-presenting, dendritic cell lines from murine epidermis. *J.Immunol*. 154:2697.
7. Takashima, A., D. Edelbaum, T. Kitajima, R. K. Shadduck, G. L. Gilmore, S. Xu, R. S. Taylor, P. R. Bergstresser, and K. Ariizumi. 1995. Colony-stimulating factor-1 secreted by fibroblasts promotes the growth of dendritic cell lines (XS series) derived from murine epidermis. *J.Immunol*. 154:5128.
8. Xu, S., K. Ariizumi, D. Edelbaum, P. R. Bergstresser, and A. Takashima. 1995. Cytokine-dependent regulation of growth and maturation in murine epidermal dendritic cell lines. *Eur.J.Immunol*. 25:1018.
9. Kitajima, T., K. Ariizumi, M. Mohamadzadeh, D. Edelbaum, P. R. Bergstresser, and A. Takashima. 1995. T cell-dependent secretion of IL-1$\beta$ by a dendritic cell line (XS52) derived from murine epidermis. *J.Immunol*. 155:3794.
10. Kitajima, T., K. Ariizumi, P. R. Bergstresser, and A. Takashima. 1995. T cell-dependent loss of proliferative responsiveness to colony-stimulating factor-1 by a murine epidermal-derived dendritic cell line, XS52. *J.Immunol*. 155:5190.
11. Kitajima, T., K. Ariizumi, P. R. Bergstresser, and A. Takashima. 1996. A novel mechanism of glucocorticoid-induced immune suppression: The inhibition of T cell-mediated terminal maturation of a murine dendritic cell line. *J.Clin.Invest*. 98:142.
12. Kitajima, T., K. Ariizumi, P. R. Bergstresser, and A. Takashima. 1996. UVB radiation sensitizes a murine epidermal dendritic cell line (XS52) to undergo apoptosis upon antigen presentation to T cells. *J.Immunol*. 157:3312.
13. Yokota, K., K. Ariizumi, T. Kitajima, P. R. Bergstresser, NE. Street, and A. Takashima. 1996. Cytokine-mediated communication between dendritic epidermal T cells and Langerhans cells. In vitro studies using cell lines. *J.Immunol*. 157:1529.
14. Ariizumi, K., T. Kitajima, P. R. Bergstresser, and A. Takashima. 1995. Interleukin-1$\beta$ converting enzyme in murine Langerhans cells and epidermal-derived dendritic cell lines. *Eur.J.Immunol*. 25:2137.
15. Mohamadzadeh, M., A. N. Poltorak, P. R. Bergstresser, B. Beutler, and A. Takashima. 1996. Dendritic cells produce macrophage inflammatory protein-1 gamma, a new member of the CC chemokine family. *J.Immunol*. 156:3102.
16. Mohamadzadeh, M., K. Ariizumi, K. Sugamura, P. R. Bergstresser, and A. Takashima. 1996. Expression of the common cytokine receptor gamma chain by murine dendritic cells including epidermal Langerhans cells. *Eur.J.Immunol*.26:156.
17. Schuhmachers, G., S. Xu, P. R. Bergstresser, and A. Takashima. 1995. Identify and functional properties of novel skin-derived fibroblast lines (NS series) that support the growth of epidermal-derived dendritic cell lines. *J.Invest.Dermatol*. 105:225.
18. Yuspa, S. H., P. Hawley-Nelson, B. Koehler, and J. R. Stanley. 1980. A survey of transformation markers in differentiating epidermal cell lines in culture. *Cancer Res*. 40:4694.
19. Applegate, L. A., R. D. Ley, J. Alcalay, and M. L. Kripke. 1989. Identification of the molecular target for the suppression of contact hypersensitivity by ultraviolet radiation. *J.Exp.Med*. 170:1117.

20. Kripke, M. L., P. A. Cox, L. G. Alas, and D. B. Yarosh. 1992. Pyrimidine dimers in DNA initiate systemic immunosuppression in UV-irradiated mice. *Proc.Natl.Acad.Sci. USA* 89:7516.

21. Ross, J. A., S. E. M. Howie, M. Norval, J. P. Maingay, and J. Simpson. 1986. Ultraviolet irradiated urocanic acid suppressed delayed-type hypersensitivity to herpes simplex virus in mice. *J.Invest.Dermatol.* 87:630.

22. Kurimoto, I. and J. W. Streilein. 1992. Cis-urocanic acid suppression of contact hypersensitivity induction is mediated via tumor necrosis factor-α. *J.Immunol.* 148:3072.

23. Krutmann, J. and M. Grewe. 1995. Involvement of cytokines, DNA damage, and reactive oxygen intermediates in ultraviolet radiation-induced modulation of intercellular adhesion molecule-1 expression. *J.Invest.Dermatol.* 105S:67.

24. Bielenberg, D. R., C. D. Bucana, R. Sanchez, C. K. Donawho, M. L. Kripke, and I. J. Fidler. 1998. Molecular regulation of UVB-induced cutaneous angiogenesis. *J.Invest.Dermatol.* 111:864.

25. Aragane, Y., D. Kulms, D. Metze, G. Wilkes, B. P oppelmann, T. A. Luger, and T. Schwarz. 1998. Ultraviolet light induces apoptosis via direct activation of CD95 (Fas/APO-1) independently of its ligand CD95L. *J.Cell Biol.* 140:171.

26. Kasibhatia, S., T. Brunner, L. Genestier, F. Echeverri, A. Mahboubi, and D. R. Green. 1998. DNA damaging agents induce expression of Fas ligand and subsequent apoptosis in T lymphocytes via the activation of NF-κB and AP-1. *Mol.Cell* 1:543.

27. Eller, M. S., K. Ostrom, and B. A. Gilchrest. 1996. DNA damage enhances melanogenesis. *Proc.Natl.Acad Sci. USA* 93:1087.

28. Eller, M. S., T. Maeda, C. Magnoni, D. Atwal, and B. A. Gilchrest. 1997. Enhancement of DNA repair in human skin cells by thymidine dinucleotides: evidence for a p53-mediated mammalian SOS response. *Proc.Natl.Acad.Sci. USA* 94:12627.

29. Vink, A. A., A. M. Moodycliffe, V. Shreedhar, S. E. Ullrich, L. Roza, D. B. Yarosh, and M. L. Kripke. 1996. The inhibition of antigen-presenting activity of dendritic cells resulting from UV irradiation of murine skin is restored by in vitro photorepair of cyclobutane pyrimidine dimers. *Proc.Natl.Acad.Sci. USA* 94:5255.

30. O'Connor, A., C. Nishigori, D. Yarosh, L. Alas, J. Kibitel, L. Burley, P. Cox, C. Bucana, S. E. Ullrich, and M. D. Kripke. 1996. DNA double strand breaks in epidermal cells cause immune suppression in vivo and cytokine production in vitro. *J.Immunol.* 157:271.

31. Morita, A., T. Werfel, H. Stege, C. Ahrens, K. Karmann, M. Grewe, S. GretherBeck, T. Ruzicka, A. Kapp, L.-O. Klotz, H. Sies, and J. Krutmann. 1997. Evidence that singlet oxygen-induced human T helper cell apoptosis is the basic mechanism of ultraviolet-A radiation phototherapy. *J.Exp. Med.* 186:1763.

32. Scharffetter-Kochanek, K., M. Wlaschek, P. Brenneisen, M. Schauen, R. Blaudschun, and J. Wenk. 1997. UV-induced reactive oxygen species in photocarcinogenesis and photoaging. *Biol. Chem.* 378:1247.

33. Rosette, C. and M. Karin. 1996. Ultraviolet light and osmotic stress: activation of the JNK cascade through multiple growth factor and cytokine receptors. *Science* 274:1194.

34. Simon, M. M., Y. Aragane, A. Schwarz, T. A. Luger, and T. Schwarz. 1994. UVB light induces nuclear factor κB (NFκB) activity independently from chromosomal DNA damage in cell-free cytosolic extracts. *J.Invest.Dermatol.* 102:422.

35. Knebel, A., H. J. Rahmsdorf, and P. Herrlich. 1996. Dephosphorylation of receptor tyrosine kinases as target of regulation by radiation, oxidants or alkylating agents. *EMBO* 15:5314.

36. Derijard, B., M. Hibi, I. H. Wu, T. Barrett, B. Su, T. Deng, M. Karin, and R. J. Davis. 1994. JNK1: a protein kinase stimulated by UV light and Ha-Ras that binds and phosphorylates the c-Jun activation domain. *Cell* 76:1025.

37. Lee, F. S., J. Hagler, J. C. Zhijian, and T. Maniatis. 1997. Activation of the IκB kinase complex by MEKK1, a kinase of the JNK pathway. *Cell* 88:213.

38. Gilchrest, B. A., H.-Y. Park, M. S. Eller, and M. Yaar. 1996. Mechanisms of ultraviolet light-induced pigmentation. *Photochem. Photobiol.* 63:1.

39. van Dam, H., D. Wilhelm, I. Herr, A. Steffen, P. Herrlich, and P. Angel. 1995. ATF-2 is preferentially activated by stress-activated protein kinases to mediate c-jun induction in response to genotoxic agents. *EMBO* 14:1798.

40. Grether-Beck, S., S. Olaizola-Horn, H. Schmitt, M. Grewe, A. Jahnke, J. P. Johnson, K. Briviba, H. Seis, and J. Krutmann. 1996. Activation of transcription factor AP-2 mediates UVA radiation-and singlet oxygen-induced expression of the human intercellular adhesion molecule 1 gene. *Proc.Natl.Acad.Sci. USA* 93:14586.

41. Iordanov, M., K. Bender, T. Ade, W. Schmidt, C. Sachsenmaier, K. Engel, M. Gaestel, H. J. Rahmsdorf, and P. Herrlich. 1997. CREB is activated by UVC through a p38-HOG-1-dependent protein kinase. *EMBO* 16:1009.

42. Schmidt, K. N., P. Amstad, P. Cerutti, and P. A. Baeuerle. 1995. The roles of hydrogen peroxide and superoxide as messengers in the activation of transcription factor NF-κB. *Chem.Biol.* 2:13.

43. Nemoto, S., J. A. DiDonato, and A. Lin. 1998. Coordinate regulation of IκB kinases by mitogen-activated protein kinase kinase kinase 1 and NF-κB-inducing kinase. *Mol. Cell. Biol.* 18:7336.

44. Barnes, P. J. and M. Karin. 1997. Nuclear factor-κB—a pivotal transcription factor in chronic inflammatory diseases. *N.Engl.J.Med.* 336:1066.

45. Baeuerle, P. A. and D. Baltimore. 1996. NF-κB: ten years after. *Cell* 87:13.

46. Toews, G. B., P. R. Bergstresser, and J. W. Streilein. 1980. Epidermal Langerhans cell density determines whether contact hypersensitivity or unresponsiveness follows skin painting with DNFB. *J.Immunol.* 124:445.

47. Elmets, C. A., P. R. Bergstresser, R. E. Tigelaar, P. J. Wood, and J. W. Streilein. 1983. Analysis of the mechanism of unresponsiveness produced by haptens painted on skin exposed to low dose ultraviolet radiation. *J. Exp. Med.* 158:781.

48. Kitajima, T. and A. Takashima. 1999. Langerhans cell responses to ultraviolet B radiation. *J.Dermatol.Sci.* 19:153.

49. Kripke, M. L., C. G. Munn, A. Jeevan, J. M. Tang, and C. Bucana. 1990. Evidence that cutaneous antigen-presenting cells migrate to regional lymph nodes during contact sensitization. *J.Immunol.* 145:2833.

50. Enk, A. H., V. L. Angeloni, M. C. Udey, and S. I. Katz. 1993. Inhibition of Langerhans cell antigen-presenting function by IL-10. A role for IL-10 in induction of tolerance. *J.Immunol.* 151:2390.

51. Enk, A. H., J. Saloga, D. Becker, M. Mohamadzadeh, and J. Knop. 1994. Induction of hapten-specific tolerance by interleukin 10 in vivo. *J.Exp.Med.* 179:1397.

52. Yoshikawa, T., V. Rae, W. Bruins-Slot, J.-W. Van den Berg, J. R. Taylor, and J. W. Streilein. 1990. Susceptibility 53. Cooper, K. D., L. Oberhelman, T. A. Hamilton, O. Baadsgaard, M. Terhune, G. LeVee, T. Anderson, and H. Koren. 1992. UV exposure reduces immunization rates and promotes tolerance to epicutaneous antigens in humans: relationship to dose, CD1a−DR+epidermal macrophage induction, and Langerhans cell depletion. *Proc.Natl.Acad.Sci. USA* 89:8497.

54. Shapiro, V. S., M. N. Mollenauer, W. C. Greene, and A. Weiss. 1996. c-Rel regulation if IL-2 gene expression may be mediated through activation of AP-1. *J.Exp.Med.* 184:1663.

55. Yablonski, D., M. R. Kuhne, T. Kadlecek, and A. Weiss. 1998. Uncoupling of nonreceptor tyrosine kinases from PLC-γ1 in an SLP-76-deficient T cell. *Science* 281:413.

What is claimed is:

1. An apparatus for generating a time and spatially dependent light spectrum comprising:
   a light source positioned to direct a light output, wherein said light source comprises a light that is redirected by a micromirror array under the control of a computer to produce said light output;
   a variable spectrum filter placed in the path of the light redirected by said light source, wherein said variable spectrum filter passes one or more spatially separated wavelengths of light; and
   said acomputer controls the relative position of said variable spectrum filter and said light output.

2. The apparatus of claim 1, wherein said computer controls the position of the variable spectrum filter in relation to the light source, wherein the light passed by the variable spectrum filter is time and wavelength controlled.

3. The apparatus of claim 1, wherein said one or more spatially separated wavelengths of light are detected by a sensor that produces an output signal and the output signal of said sensor is directed to said computer, wherein said computer directs the position of the variable spectrum signal and said light source based on the output signal of said sensor.

4. The apparatus of claim 1, wherein said light output is a UV light, visible or infrared light.

5. The apparatus of claim 1, further comprising one or more lenses between said light source and a target, wherein one or more lenses are further defined as a lens system that may change the magnification of light in one or more dimensions reflected by said light source.

6. The apparatus of claim 1, wherein said micromirror array is further defined as a two-dimensional micrornirror array.

7. The apparatus of claim 1, further comprising one or more diffusion lenses between said light source and said micromirror array.

8. The apparatus of claim 1, wherein said one or more wavelengths of light catalyze a reaction involving a light catalyzable compound proximate said target.

9. The apparatus of claim 1, further comprising:
   a CCD camera positioned to receive light from said target to measure the intensity and wavelength of the light striking said target; and
   said computer connected to, controlling and receiving the output from said CCD camera.

10. The apparatus of claim 1, wherein said light output is a combination of UV light, visible and infrared light.

11. The apparatus of claim 1, wherein said one or more wavelengths of light interact with said target to produce the activation of one or more cellular functions at a site of the target.

12. The apparatus of claim 1, wherein said one or more wavelengths of light catalyze the activation of one or more nucleotide bases at said target.

13. The apparatus of claim 1, wherein said one or more wavelengths of light catalyze the activation of a light catalyzable reaction involving one or more amino acid residue at said target.

14. The apparatus of claim 1, wherein said one or more wavelengths of light crosslink a molecule proximate said target.

15. An apparatus for projecting one or more wavelengths of light comprising:
   a light source positioned to redirect light from said light source toward a target, wherein said light source is further defined as comprising a light that produces one or more wavelengths of light that are redirected by a micromirror array under the control of a computer to produce said light;
   a variable spectrum generator positioned to pass one or more spatially separated wavelengths of light from said light source; and
   said computer connected to, and controlling, said light source and said variable spectrum generator to pass one or more wavelengths of light from said light source toward said target.

16. The apparatus of claim 15, wherein said computer can control the position of the variable spectrum generator in relation to the light source, wherein the light passed by the variable spectrum generator is time and wavelength controlled.

17. The apparatus of claim 15, wherein said one or more wavelengths of light are detected at be a sensor that produced an output signal and the output signal of said sensor is directed to said computer, wherein said computer directs the position of the variable spectrum generator and said light source based on the output signal of said sensor.

18. The apparatus of claim 15, wherein said light that produces one or more spatially separated wavelengths is a xenon lamp, or a mercury lamp, or a laser or a combination thereof.

19. The apparatus of claim 15, further comprising a total internal reflection mirror disposed in a position to redirect output of said light.

20. The apparatus of claim 15, wherein said target is mounted and illuminated on a movable platform that is controlled via said computer to allow for multiple repetitive exposures of said target to said one or more spatially separated wavelengths of light passed by said variable spectrum generator.

* * * * *